(12) United States Patent
Chu

(10) Patent No.: US 8,917,572 B2
(45) Date of Patent: Dec. 23, 2014

(54) SEMICONDUCTOR MEMORY DEVICE AND METHOD OF TESTING THE SAME

(71) Applicant: SK hynix Inc., Icheon-si (KR)

(72) Inventor: Shin Ho Chu, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 182 days.

(21) Appl. No.: 13/719,066

(22) Filed: Dec. 18, 2012

(65) Prior Publication Data

US 2014/0050035 A1    Feb. 20, 2014

(30) Foreign Application Priority Data

Aug. 20, 2012    (KR) .................. 10-2012-0090933

(51) Int. Cl.
G11C 8/00 (2006.01)
G11C 7/00 (2006.01)
G11C 29/08 (2006.01)
G11C 29/34 (2006.01)
G11C 29/12 (2006.01)
G11C 29/26 (2006.01)

(52) U.S. Cl.
CPC ........ *G11C 29/08* (2013.01); *G11C 2029/2602* (2013.01); *G11C 7/00* (2013.01); *G11C 29/34* (2013.01); *G11C 29/12* (2013.01)

USPC ............ 365/230.06; 365/230.03; 365/189.16; 365/189.15; 365/201

(58) Field of Classification Search
None
See application file for complete search history.

(56) References Cited

U.S. PATENT DOCUMENTS 7,773,439 B2 * 8/2010 Do et al. ................ 365/201

FOREIGN PATENT DOCUMENTS

KR    1020090094604 A    9/2009

* cited by examiner

*Primary Examiner* — Kretelia Graham
(74) *Attorney, Agent, or Firm* — Kilpatrick Townsend & Stockton LLP

(57) ABSTRACT

A semiconductor memory device includes a write controller configured to transmit a first input data that is supplied through a first pad, to a first global I/O line and a second global I/O line when a write operation is executed in a test mode. The semiconductor memory device further includes a first write driver configured to store the first input data via the first global I/O line in a first cell block when the write operation is executed in the test mode. The semiconductor memory device further includes a first I/O line driver configured to supply signals to the first global I/O line and a first test I/O line in response to a first output data supplied from the first cell block when a read operation is executed in the test mode.

32 Claims, 6 Drawing Sheets

SEMICONDUCTOR MEMORY DEVICE AND METHOD OF TESTING THE SAME

CROSS-REFERENCE TO RELATED APPLICATION

The present application claims priority under 35 U.S.C 119(a) to Korean Application No. 10-2012-0090933, filed on Aug. 20, 2012, in the Korean Intellectual Property Office, the content of which is incorporated herein by reference in its entirety.

BACKGROUND

Following fabrication, semiconductor memory devices often undergo a number of functional tests to determine their suitability for commercial sale. Such testing may be performed to evaluate functions of peripheral circuits and memory cells forming the semiconductor memory devices. Many of the semiconductor memory devices tend to exhibit single bit failures rather than dual bit and/or cluster bit failures. Accordingly, as the semiconductor memory devices become more complex and achieve higher levels of integration, their test time also increases. To reduce the test time, a parallel test has been proposed. The parallel test may be performed by simultaneously writing the same data into a plurality of memory cells of the semiconductor memory device and by simultaneously reading the data stored in the plurality of memory cells.

In general, test input/output (I/O) lines in addition to global I/O lines may be required to perform the parallel test. Accordingly, when a read operation is executed in the parallel test mode, the data stored in the memory cells may be loaded onto a plurality of test I/O lines whose data levels are detected or sensed to determine the functionality of the memory cells. In other words, during the parallel test mode, the data stored in the memory cells may be supplied through the test I/O lines instead of the global I/O lines through which the data stored in the memory cells are supplied during a normal read mode.

A semiconductor memory device may be designed to have one of various bit organizations such as "×4", "×8", "×16", "×32" and the like. For example, a semiconductor memory device that has a bit organization of "×16" is adapted to store 16 bits of data during a write operation or supply 16 bits of data during a read operation.

SUMMARY

Embodiments are directed to semiconductor memory devices and methods of testing the same.

According to some embodiments, a semiconductor memory device includes, in part, a write controller, a write driver, and an I/O line driver. The write controller is configured to transmit a first input data supplied from a first pad to a first global I/O line and a second global I/O line when a write operation is executed in a test mode. The write driver is configured to store the first input data on the first global I/O line in a first cell block when the write operation is executed in the test mode. The I/O line driver is configured to drive both the first global I/O line and a first test I/O line in response to a first output data received from the first cell block when a read operation is executed in the test mode.

According to another embodiment, a semiconductor memory device includes, in part, a write controller, a write driver, and an I/O line driver. The write controller is configured to transmit a first input data supplied from a first pad to a first global I/O line and a second global I/O line when a write operation is executed in a first test mode or a second test mode. The write driver is configured to store the first input data on the first global I/O line in a first cell block when the write operation is executed in the first or second test mode. The I/O line driver is configured to drive a first test I/O line in response to receiving a first output data from the first cell block when a read operation is executed in the first test mode. The I/O line driver is further configured to drive both the first global I/O line and the first test I/O line in response to receiving the first output data when the read operation is executed in the second test mode.

According to another embodiment, a method of testing a semiconductor memory device includes, in part, executing a write operation followed by a read operation. The write operation is executed to load a first input data from a first pad onto first and second global I/O lines, to store the first input data on the first global I/O line in a first cell block, and to store the first input data on the second global I/O line in a second cell block. The read operation is executed to drive both the first global I/O line and a first test I/O line in response to a first output data received from the first cell block, and to drive both the second global I/O line and a second test I/O line in response to a second output data received from the second cell block.

A method of operating a semiconductor memory device, in accordance with another embodiment, includes, in part, transmitting a first input data from a first pad to a first and second global I/O lines, transferring the first input data from the first global I/O line to a first cell block, storing the transferred first input data in the first cell block, supplying a signal to a first test I/O line in response to receiving the data stored in the first cell block during a first test mode, and supplying the signal to the first global I/O line and the first test I/O line in response to receiving the output data stored in the first cell block during a second test mode.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Embodiments of the inventive concept will be described hereinafter with reference to the accompanying drawings. However, the embodiments described herein are for illustrative purposes only and are not intended to limit the scope of the inventive concept.

Figure 1:
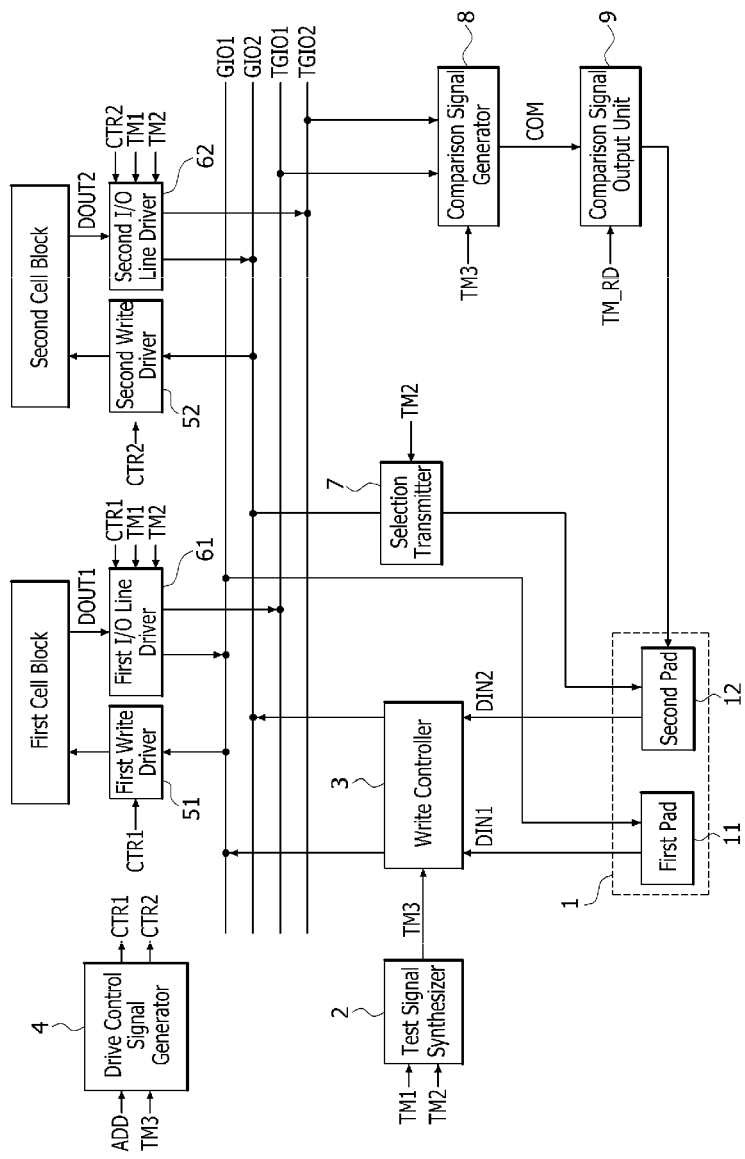
FIG. 1 is a block diagram of a semiconductor memory device according to one embodiment.

FIG. 1 is a block diagram of a semiconductor memory device 100, according to one embodiment.

Semiconductor memory device 100 is shown as including a pad portion 1, a test signal synthesizer 2, a write controller 3, a drive control signal generator 4, a first write driver 51, a second write driver 52, a first I/O line driver 61, a second I/O line driver 62, a selection transmitter 7, a comparison signal generator 8 and a comparison signal output unit 9.

The pad portion 1 may include a first pad 11 and a second pad 12 through which data are supplied to or received from Semiconductor memory device 100. For example, a first input data DIN1 may be supplied from first pad 11, and data on a first global I/O line GIO1 may be supplied to first pad 11. Similarly, a second input data DIN2 may be supplied from second pad 12, and data on a second global I/O line GIO2 may be supplied to the second pad 12. In the parallel test mode, no data is supplied to or received from second pad 12.

The test signal synthesizer 2 may be configured to generate a third test mode signal TM3 which is enabled when a first test mode signal TM1 or a second test mode signal TM2 is enabled. The first test mode signal TM1 may be enabled in a first test mode during which first input data DIN1 supplied from first pad 11 is stored in first and second cell blocks 70, 75, and the data stored in the first cell block 70 is compared with the data stored in the second cell block 75 to determine whether the memory cells in the first and second cell blocks 70, 75 operate properly. Further, after the data stored in the first cell block 70 is verified through first pad 11, the second test mode signal TM2 may be enabled in a second test mode during which first input data DIN1 supplied from the first pad 11 is stored in first and second cell blocks 70, 75 and the data stored in the first cell block 70 is compared with the data stored in the second cell block 75 to determine whether the memory cells in the first and second cell blocks 70, 75 operate properly, and the data stored in the first cell block 70 may be supplied to the first pad to be verified.

Write controller 3 may receive the first input data DIN1 through the first pad 11 to drive the first and second global I/O lines GIO1 and GIO2 when the semiconductor memory device operates in the first or second test mode. In contrast, when the semiconductor memory device operates 100 in a read mode or a write mode instead of the first or second test mode, write controller 3 may receive (i) first input data DIN1 through first pad 11 to drive the first global I/O line GIO1 and (ii) the second input data DIN2 through second pad 12 to drive the second global I/O line GIO2.

The drive control signal generator 4 may be configured to generate any one of a first drive control signal CTR1 or a second drive control signal CTR2 in response to an address signal ADD during a read or a write operation. In contrast, when the read or write operation is executed during the first or second test mode, the drive control signal generator 4 may generate and thus enable both the first and second drive control signals CTR1 and CTR2.

The first write driver 51 may be configured to store the data via the first global I/O line GIO1 in the first cell block 70 when the first drive control signal CTR1 is enabled. The second write driver 52 may be configured to store the data via the second global I/O line GIO2 in the second cell block 75 when the second drive control signal CTR2 is enabled.

The first I/O line driver 61 may receive a first output data DOUT1 from the first cell block 70 to drive the first global I/O line GIO1 and/or the first test I/O line TGIO1 according to the first and second test mode signals TM1 and TM2 when the first drive control signal CTR1 is enabled. More specifically, the first I/O line driver 61 may receive the first output data DOUT1 from the first cell block 70 to (i) drive the first test I/O line TGIO1 when a read operation is executed during the first test mode, or (ii) drive both the first global I/O line GIO1 and the first test I/O line TGIO1 when a read operation is executed during the second test mode.

The second I/O line driver 62 may receive a second output data DOUT2 from the second cell block 75 to drive the second global I/O line GIO2 and/or the second test I/O line TGIO2 according to the first and second test mode signals TM1 and TM2 when the second drive control signal CTR2 is enabled. More specifically, the second I/O line driver 62 may receive the second output data DOUT2 from the second cell block 75 to (i) drive the second test I/O line TGIO2 when a read operation is executed during the first test mode, or (ii) drive both the second global I/O line GIO2 and the second test I/O line TGIO2 when a read operation is executed during the second test mode.

The selection transmitter 7 may be configured to prevent the data on the second global I/O line GIO2 from being transmitted to the second pad 12 when the read operation is executed during the second test mode. The selection transmitter 7 may transmit the data on the second global I/O line GIO2 to the second pad 12 when a read operation is executed in a normal mode but not during the first and second test modes.

The comparison signal generator 8 may compare the data on the first test I/O line TGIO1 with the data on the second test I/O line TGIO2 to generate a comparison signal COM. In some embodiments, the comparison signal COM may have a logic "high" level when the data on the first test I/O line TGIO1 has the same value as the data on the second test I/O line TGIO2, and a logic "low" level when the data on the first test I/O line TGIO1 has a different value from the data on the second test I/O line TGIO2. However, other logic levels may also be used to indicate whether the data on the first test I/O line TGIO1 and the second test I/O line TGIO2 are similar or different. For example, in other embodiments, the comparison signal COM may have a logic "low" level when the data on the first test I/O line TGIO1 has the same value as the data on the second test I/O line TGIO2, and a logic "high" level when the data on the first test I/O line TGIO1 has a different value from the data on the second test I/O line TGIO2.

The comparison signal output unit 9 may transmit the comparison signal COM to the second pad 12 when a read test mode signal TM_RD is enabled. The read test mode signal TM_RD may be enabled if the comparison signal COM is generated after the read operations in the first and second test modes. The first test mode signal TM1, the second test mode signal TM2 and the read test mode signal TM_RD may be generated by an external test circuit or by a test mode signal generator (not shown) included in the semiconductor memory device.

Figure 2:
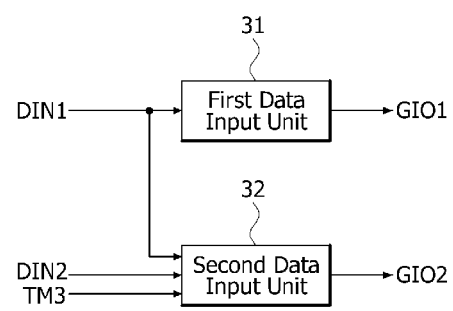
FIG. 2 is a block diagram of one embodiment of the write controller of the semiconductor memory device shown in FIG. 1.

FIG. 2 is a block diagram of write controller 3 of semiconductor memory device of FIG. 1, in accordance with one embodiment.

As illustrated in FIG. 2, the write controller 3 may be configured to include a first data input unit 31 and a second data input unit 32. The first data input unit 31 may transmit the first input data DIN1 to the first global I/O line GIO1. That is, the first data input unit 31 may drive the signal on the first global I/O line GIO1 in response to the first input data DIN1. The second data input unit 32 may transmit the first input data DIN1 to the second global I/O line GIO2 when the third test mode signal TM3 is enabled and may transmit the second input data DIN2 to the second global I/O line GIO2 when the third test mode signal TM3 is disabled. As described above, the third test mode signal TM3 may be enabled when the semiconductor memory device operates in the first or second test mode. Thus, the second data input unit 32 may transmit the first input data DIN1 to the second global I/O line GIO2 when the semiconductor memory device operates in the first or second test mode and may transmit the second input data DIN2 to the second global I/O line GIO2 when the semiconductor memory device does not operate in the first or second test modes.

Figure 3:
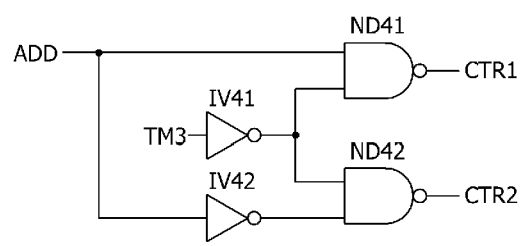
FIG. 3 is a circuit diagram of one embodiment of the drive control signal generator of the semiconductor memory device shown in FIG. 1.

FIG. 3 is a circuit diagram of drive control signal generator 4 of semiconductor memory device 100 of FIG. 1, in accordance with one embodiment.

As illustrated in FIG. 3, the drive control signal generator 4 may generate the first and second drive control signals CTR1 and CTR2 which are enabled to have a logic "high" level when the third test mode signal TM3 is enabled to have a logic "high" level. Further, the drive control signal generator 4 may generate the first and second drive control signals CTR1 and CTR2 whose logic levels are determined according to the address signal ADD when the third test mode signal TM3 is disabled to have a logic "low" level. Hence, when the third test mode signal TM3 is disabled to have a logic "low" level, the first drive control signal CTR1 may be enabled to have a logic "high" level if the address signal ADD has a logic "low" level and the second drive control signal CTR2 may be enabled to have a logic "high" level if the address signal ADD has a logic "high" level.

Figure 4:
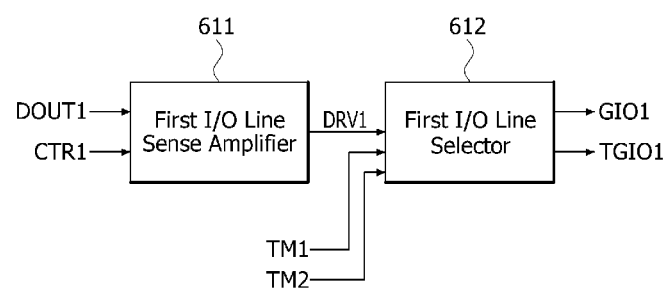
FIG. 4 is a block diagram of one embodiment of the first I/O line driver of the semiconductor memory device shown in FIG. 1.

FIG. 4 is a block diagram of first I/O line driver 61 of semiconductor memory device 100 of FIG. 1, in accordance with one embodiment.

As illustrated in FIG. 4, the first I/O line driver 61 includes a first I/O line sense amplifier 611 and a first I/O line selector 612. The first I/O line sense amplifier 611 may sense and amplify a signal of the first output data DOUT1 to generate a first drive signal DRV1 when the first drive control signal CTR1 is enabled. The first I/O line selector 612 may receive the first drive signal DRV1 to drive the signal on the first global I/O line GIO1 and/or the signal on the first test I/O line TGIO1 according to the first and second test mode signals TM1 and TM2. When the first test mode signal TM1 is enabled in the first test mode, the first I/O line selector 612 may drive the signal on the first test I/O line TGIO1 in response to the first drive signal DRV1. Further, when the second test mode signal TM2 is enabled in the second test mode, the first I/O line selector 612 may drive the signal on the first global I/O line GIO1 and the signal on the first test I/O line TGIO1 in response to the first drive signal DRV1. When the semiconductor memory device does not operate in the first or second test modes, the first I/O line selector 612 may drive the signal on the first global I/O line GIO1 in response to the first drive signal DRV1.

Figure 5:
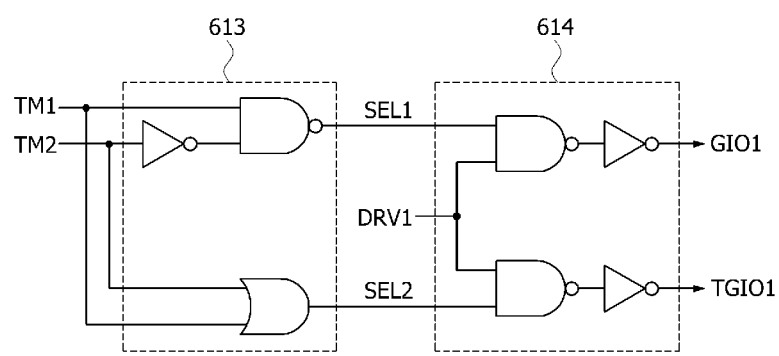
FIG. 5 is a circuit diagram of one embodiment of the first input/output line selector of the first I/O line driver shown in FIG. 4.

FIG. 5 is a circuit diagram of first input/output line selector 612 of FIG. 4, in accordance with one embodiment.

As illustrated in FIG. 5, the first I/O line selector 612 includes a selection signal generator 613 and a selection driver 614. During the first test mode when signal TM1 is enabled to have a logic "high" level, the selection signal generator 613 disables signal SEL1 by causing it to have a logic "low" level, and enables signal SEL2 by causing it to have a logic "high" level. Further, during the second test mode when signal TM2 is enabled to have a logic "high" level, the selection signal generator 613 enables signals SEL1 and SEL2 by causing them to have a logic "high" level. In addition, when the semiconductor memory devise is not in the first or second test modes, i.e., when signals TM1 and TM2 are both low, the selection signal generator 613 enables signal SEL1 by causing it to have a logic "high" level, and disables signal SEL2 by causing it to have a logic "low" level. The selection driver 614 may buffer the first drive signal DRV1 to drive the signal on the first global I/O line GIO1 when the first selection signal SEL1 is enabled. Further, the selection driver 614 may buffer the first drive signal DRV1 to drive the signal on the first test I/O line TGIO1 when the second selection signal SEL2 is enabled.

Figure 6:
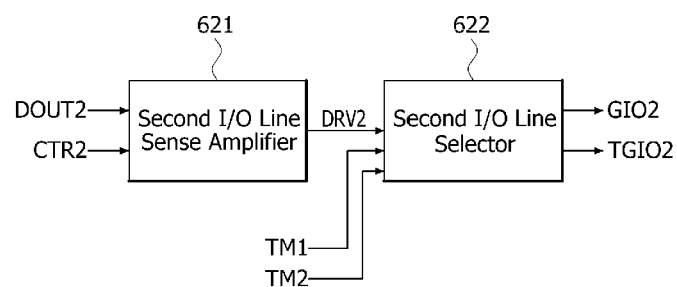
FIG. 6 is a block diagram of one embodiment of the second I/O line driver of the semiconductor memory device shown in FIG. 1.

FIG. 6 is a block diagram of second I/O line driver 62 of FIG. 1, in accordance with one embodiment.

As illustrated in FIG. 6, the second I/O line driver 62 includes a second I/O line sense amplifier 621 and a second I/O line selector 622. The second I/O line sense amplifier 621 may sense and amplify a signal of the second output data DOUT2 to generate a second drive signal DRV2 when the second drive control signal CTR2 is enabled. The second I/O line selector 622 may receive the second drive signal DRV2 to drive the signal on the second global I/O line GIO2 and/or the signal on the second test I/O line TGIO2 according to the first and second test mode signals TM1 and TM2. Specifically, during the first test mode when the first test mode signal TM1 is enabled, the second I/O line selector 622 may drive the signal on the second test I/O line TGIO2 in response to the second drive signal DRV2. Further, during the second test mode when the second test mode signal TM2 is enabled, the second I/O line selector 622 may drive the signal on the second global I/O line GIO2 and the signal on the second test I/O line TGIO2 in response to the second drive signal DRV2. When the semiconductor memory device does not operate in the first or second test modes, the second I/O line selector 622 may drive the signal on the second global I/O line G1O2 in response to the second drive signal DRV2.

A method of testing the semiconductor memory device according to the embodiment will be described hereinafter with reference to FIGS. 1 to 6. The following includes descriptions of a first test performed when the first test mode signal TM1 is enabled during the first test mode, and a second test performed when the second test mode signal TM2 is enabled in the second test mode. The tests for determining whether the memory cells operate properly or not may be performed by sequentially executing a write operation and a read operation.

Now, the first test will be described.

First, in the event that a write operation is executed while the first test mode signal TM1 is enabled, the test signal synthesizer 2 may enable the third test mode signal TM3. Thus, the write controller 3 may receive the first input data DIN1 through the first pad 11 and may transmit the first input data DIN1 to the first and second global I/O lines GIO1 and GIO2. Further, the drive control signal generator 4 may generate the first and second drive control signals CTR1 and CTR2 which are all enabled when a write operation is executed with the first test mode signal TM1 enabled. Thus, the first write driver 51 may store the data on the first global I/O line GIO1 in the first cell block in response to the first drive control signal CTR1 being enabled, and the second write driver 52 may store the data on the second global I/O line GIO2 in the second cell block 75 in response to the second drive control signal CTR2 being enabled.

Subsequently, when a read operation is executed with the first test mode signal TM1 enabled, the data stored in the first cell block 70 may be supplied as the first output data DOUT1 and the data stored in the second cell block 75 may be supplied as the second output data DOUT2. Even when the read operation is executed, the drive control signal generator 4 may still enable the first and second drive control signals CTR1 and CTR2. Thus, the first I/O line driver 61 may transmit the first output data DOUT1 to the first test I/O line TGIO1 in response to enabling the first drive control signal CTR1, and the second I/O line driver 62 may transmit the second output data DOUT2 to the second test I/O line TGIO2 in response enabling to the second drive control signal CTR2.

The comparison signal generator 8 may compare the data on the first test I/O line TGIO1 with the data on the second test I/O line TGIO2 to generate the comparison signal COMP. The comparison signal COMP may be transmitted to the second pad 12 when the read test mode signal TM_RD is enabled. A logic level of the comparison signal COMP supplied from the second pad 12 may indicate whether the data on the first test I/O line TGIO1 and the data on the second test I/O line TGIO2 are consistent with each other or not. If the comparison signal COMP indicates that the data on the first test I/O line TGIO1 and the data on the second test I/O line TGIO2 are inconsistent with each other, there may be at least one failed memory cell in the first and second cell blocks 70, 75.

Hereinafter, the second test, which is performed when the second test mode signal TM2 is enabled in the second test mode, will be described.

First, in the event that a write operation is executed while the second test mode signal TM2 is enabled, the test signal synthesizer 2 may enable the third test mode signal TM3. Thus, the write controller 3 may receive the first input data DIN1 through the first pad 11 and may transmit the first input data DIN1 to the first and second global I/O lines GIO1 and GIO2. Further, the drive control signal generator 4 may enable the first and second drive control signals CTR1 and CTR2 when a write operation is executed with the second test mode signal TM2 enabled. Thus, the first write driver 51 may store the data on the first global I/O line GIO1 in the first cell block 70 in response to the first drive control signal CTR1 being enabled, and the second write driver 52 may store the data on the second global I/O line GIO2 in the second cell block 75 in response to the second drive control signal CTR2 being enabled.

Subsequently, when a read operation is executed with the second test mode signal TM2 enabled, the data stored in the first cell block 70 may be supplied as the first output data DOUT1 and the data stored in the second cell block 75 may be supplied as the second output data DOUT2. Even when the read operation is executed, the drive control signal generator 4 may still enable the first and second drive control signals CTR1 and CTR2. Thus, the first I/O line driver 61 may transmit the first output data DOUT1 to both the first global I/O line GIO1 and the first test I/O line TGIO1 in response to the first drive control signal CTR1 being enabled, and the second I/O line driver 62 may transmit the second output data DOUT2 to both the second global I/O line GIO2 and the second test I/O line TGIO2 in response to the second drive control signal CTR2 being enabled. The first output data DOUT1 on the first global I/O line GIO1 may be transmitted to the first pad 11. The data supplied from the first pad 11 may be verified to determine whether the first cell block 70 includes at least one failed memory cell. During verification of the data supplied from the first pad 11, the selection transmitter 7 may be configured to prevent the second output data DOUT2 on the second global I/O line GIO2 from being transmitted to the second pad 12.

The comparison signal generator 8 may compare the data on the first test I/O line TGIO1 with the data on the second test I/O line TGIO2 to generate the comparison signal COMP. The comparison signal COMP may be transmitted to the second pad 12 when the read test mode signal TM_RD is enabled. A logic level of the comparison signal COMP supplied from the second pad 12 may indicate whether the data on the first test I/O line TGIO1 and the data on the second test I/O line TGIO2 are consistent with each other or not. If the comparison signal COMP indicates that the data on the first test I/O line TGIO1 and the data on the second test I/O line TGIO2 are inconsistent with each other, there may be at least one failed memory cell in the first and second cell blocks 70, 75.

As described above, a method of testing a semiconductor memory device according to the embodiment may be performed by concurrently writing a plurality of data into a plurality of cell blocks and concurrently reading out the plurality of data stored in the cell blocks. More specifically, according to some embodiments, first input data supplied through a first pad may be stored in the first and second cell blocks 70, 75, and the data stored in the first and second cell blocks 70, 75 may be concurrently verified to determine whether at least one failed memory cell exists in the first and second cell blocks 70, 75. As a result, a test time may be reduced. Particularly, when the semiconductor memory device according to the embodiments operates in a second test mode, the first input data supplied through the first pad may be concurrently stored in the first and second cell blocks 70, 75, and the data stored in the first cell block 70 may be supplied to the first pad to be verified. In addition, while the data in the first cell block 70 is verified, the data in the first cell block 70 and the data in the second cell block 75 may be compared with each other, and the comparison result may be supplied to a second pad to determine whether memory cells in the second cell block 75 operate properly. Unlike the first test mode, according to the second test mode, the data on the first global I/O line GIO1 may be verified through the first pad. Thus, if the data supplied from the first pad is verified in the second test mode, it may be possible to figure out whether the first cell block 70 includes at least one failed memory cell.

In the test methods according to the embodiments, even when a single bit of data is supplied, two bits of data may be internally processed in parallel. This means that a bit organization of the data processed inside the semiconductor memory device is twice that of the data processed through a pad portion. The semiconductor memory devices may be designed to have various bit organizations. In some embodiments, if the bit organization of the data processed through the pad portion is "×16", the data processed inside the semiconductor memory device may be transmitted by the bit organization of "×32".

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory device comprising:
    a write controller configured to transmit a first input data from a first pad to a first global I/O line and a second global I/O line when a write operation is executed during a test mode;
    a first write driver configured to transfer the first input data from the first global I/O line to a first cell block so as to cause the first input data to be stored in the first cell block when the write operation is executed during the test mode; and
    a first I/O line driver configured to supply signals to the first global I/O line and to a first test I/O line in response to receiving a first output data from the first cell block when a read operation is executed during the test mode.

2. The semiconductor memory device of claim 1, wherein the signal on the first global I/O line is supplied via the first pad when the read operation is executed during the test mode.

3. The semiconductor memory device of claim 1, further comprising a drive control signal generator configured to enable first and second drive control signals when the write operation or the read operation is executed during the test mode.

4. The semiconductor memory device of claim 3, wherein the first I/O line driver comprises:
  a first I/O line sense amplifier configured to sense and amplify the first output data in response to the first drive control signal to generate a first drive signal; and
  a first I/O line selector configured to supply signals to both the first global I/O line and the first test I/O line in response to the first drive signal during the test mode.

5. The semiconductor memory device of claim 1, further comprising a second write driver configured to transfer the first input data from the second global I/O line to a second cell block so as to cause the first input data to be stored in the second cell block when the write operation is executed during the test mode.

6. The semiconductor memory device of claim 5, further comprising a second I/O line driver configured to supply signals to the second global I/O line and to a second test I/O line in response to receiving a second output data from the second cell block when the read operation is executed during the test mode.

7. The semiconductor memory device of claim 6, further comprising a selection transmitter configured to prevent the signal on the second global I/O line from being transmitted to a second pad when the read operation is executed during the test mode.

8. The semiconductor memory device of claim 6, further comprising a comparison signal generator configured to compare the signal on the first test I/O line with the signal on the second test I/O line and generate a comparison signal in response when the read operation is executed during the test mode.

9. The semiconductor memory device of claim 8, further comprising a comparison signal output unit configured to transmit the comparison signal to a second pad in response to a read test mode signal.

10. A semiconductor memory device comprising:
  a write controller configured to transmit a first input data from a first pad to a first global I/O line and a second global I/O line when a write operation is executed during a first test mode or a second test mode;
  a first write driver configured to transfer the first input data from the first global I/O line to a first cell block so as to cause the first input data to be stored in the first cell block when the write operation is executed during the first test mode or second test mode; and
  a first I/O line driver configured to supply a signal to a first test I/O line in response to receiving a first output data from the first cell block when a read operation is executed during the first test mode, said first I/O line driver being further configured to supply the signal to the first global I/O line and to the first test I/O line in response to receiving the first output data when the read operation is executed during the second test mode.

11. The semiconductor memory device of claim 10, wherein the signal on the first global I/O line is supplied via the first pad when the read operation is executed during the second test mode.

12. The semiconductor memory device of claim 10, further comprising a drive control signal generator configured to enable first and second drive control signals when the write operation or the read operation is executed during the first test mode or the second test mode.

13. The semiconductor memory device of claim 12, wherein the first I/O line driver comprises:
  a first I/O line sense amplifier configured to sense and amplify the first output data in response to the first drive control signal to generate a first drive signal; and
  a first I/O line selector configured to supply signals to both the first global I/O line and the first test I/O line in response to the first drive signal during the first test mode or the second test mode.

14. The semiconductor memory device of claim 10, further comprising a second write driver configured to transfer the first input data from the second global I/O line to a second cell block so as to cause the first input data to be stored in the second cell block when the write operation is executed during the first test mode or the second test mode.

15. The semiconductor memory device of claim 14, further comprising a second I/O line driver configured to supply a signal to a second test I/O line in response to a second output data received from the second cell block when the read operation is executed during the first test mode, said second I/O line driver being further configured to supply signals to both the second global I/O line and the second test I/O line in response to the second output data when the read operation is executed during the second test mode.

16. The semiconductor memory device of claim 15, further comprising a selection transmitter configured to prevent the signal on the second global I/O line from being transmitted to a second pad when the read operation is executed during the second test mode.

17. The semiconductor memory device of claim 15, further comprising a comparison signal generator configured to compare the signal on the first test I/O line with the signal on the second test I/O line and generate a comparison signal in response when the read operation is executed during the first test mode or the second test mode.

18. The semiconductor memory device of claim 17, further comprising a comparison signal output unit configured to transmit the comparison signal to a second pad in response to a read test mode signal.

19. A method of testing a semiconductor device, the method comprising:
  executing a write operation comprising:
    loading a first input data from a first pad onto first and second global I/O lines;
    storing the first input data in a first cell block via the first global IO line; and
    storing the first input data in a second cell block via the second global I/O line; and
  executing a read operation comprising:
    supplying a signal to the first global I/O line and to a first test I/O line in response to receiving a first output data from the first cell block; and
    supplying a signal to the second global I/O line and to a second test I/O line in response to receiving a second output data from the second cell block.

20. The method of claim 19, wherein the read operation further comprises transmitting the signal on the first global I/O line to the first pad.

21. The method of claim 20, wherein the read operation further comprises preventing the signal on the second global I/O line from being transmitted to a second pad.

22. The method of claim 21, wherein the read operation further comprises comparing the signal on the first test I/O line with the signal on the second test I/O line to generate a comparison signal in response.

23. The method of claim 22, wherein the read operation further comprises transmitting the comparison signal to the second pad in response to a read test mode signal.

24. A method of operating a semiconductor memory device, the method comprising:
transmitting a first input data from a first pad to a first global I/O line and a second global I/O line;
transferring the first input data from the first global I/O line to a first cell block;
storing the transferred first input data in the first cell block;
supplying a signal to a first test I/O line in response to receiving first output data stored in the first cell block during a first test mode; and
supplying the signal to the first global I/O line and the first test I/O line in response to receiving the first output data during a second test mode.

25. The method of claim 24 further comprising:
supplying the signal to the first global I/O line via the first pad.

26. The method of claim 24 further comprising:
enabling first and second drive control signals.

27. The method of claim 26 further comprising:
sensing the first output data in response to the first drive control signal to generate a first drive signal; and
supplying signals to both the first global I/O line and the first test I/O line in response to the first drive signal.

28. The method of claim 24 further comprising:
transferring the first input data from the second global I/O line to a second cell block; and
storing the transferred first input data in the second cell block.

29. The method of claim 28 further comprising:
supplying a signal to a second test I/O line in response to a second output data received from the second cell block during the first test mode; and
supplying a signal to both the second global I/O line and the second test I/O line in response to the second output data during the second test mode.

30. The method of claim 29 further comprising:
preventing the signal on the second global I/O line from being transmitted to a second pad during the second test mode.

31. The method of claim 29 further comprising:
comparing the signal on the first test I/O line with the signal on the second test I/O line; and
generating a comparison signal in response to the comparing.

32. The method of claim 31 further comprising:
transmitting the comparison signal to a second pad.

\* \* \* \* \*